United States Patent [19]

Hata et al.

[11] Patent Number: 4,985,222
[45] Date of Patent: Jan. 15, 1991

[54] PROCESS FOR PREPARATION OF ALUMINUM BORATE WHISKER

[75] Inventors: Hajime Hata; Hajime Kanbara, both of Marugame, Japan

[73] Assignee: Shikoku Chemicals Corporation, Kagawa, Japan

[21] Appl. No.: 437,630

[22] Filed: Nov. 17, 1989

[51] Int. Cl.$^5$ .............................................. C01B 35/12
[52] U.S. Cl. ............................ 423/279; 156/DIG. 61; 156/DIG. 112; 423/277; 501/95
[58] Field of Search .................... 501/52, 127, 153, 95; 156/DIG. 12, DIG. 61; 423/277, 279

[56] References Cited

U.S. PATENT DOCUMENTS

| | | | |
|---|---|---|---|
| 3,080,242 | 3/1963 | Berry | 501/95 |
| 3,350,166 | 10/1967 | Alley et al. | 156/614 |
| 4,774,210 | 9/1988 | Ray | 501/127 |
| 4,789,422 | 12/1988 | Misra | 156/DIG. 61 |
| 4,925,641 | 5/1990 | Kitamura et al. | 423/279 |

FOREIGN PATENT DOCUMENTS 0296779 12/1988 European Pat. Off. ............ 423/279

OTHER PUBLICATIONS

Bailar et al., *Comprehensive Inorganic Chemistry*, 1973, pp. 1055–1057.

*Primary Examiner*—Gary P. Straub
*Assistant Examiner*—Stephen G. Kalinchak
*Attorney, Agent, or Firm*—Sherman and Shalloway

[57] ABSTRACT

Disclosed is a process for the preparation of an aluminum borate whisker, which comprises mixing a trialkali aluminum trisulfate represented by the following general formula:

$$M_3Al(SO_4)_3$$

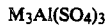

wherein M represents an alkali metal, with at least one boric anhydride source component selected from the group consisting of boron oxides, boron oxyacids and alkali metal salts thereof, and carrying out reaction and growth at a temperature of from 700° to 1200° C.

5 Claims, No Drawings

PROCESS FOR PREPARATION OF ALUMINUM BORATE WHISKER

BACKGROUND OF THE INVENTION

The present invention relates to a process for the preparation of an aluminum borate whisker.

The aluminum borate whisker prepared according to the process of the present invention is excellent in mechanical strength, heat resistance, heat-insulating property, chemical resistance, electrically insulating property and neutron-absorbing property, and this whisker is valuable as a reinforcer for a thermoplastic resin, thermosetting resin, cement, glass or metal.

DESCRIPTION OF THE PRIOR ART

Various processes have been tried for aluminum borate whiskers excellent in mechanical strength, chemical resistance and other properties, and these processes are roughly divided into the gas phase method and the liquid phase method using a flux.

As the gas phase method, the specification of U.S. Pat. No. 3,350,166 describes that by passing water vapor through gaseous aluminum fluoride and boron oxide at a temperature of 1000° to 1400° C., a whisker having a composition of $4Al_2O_3.B_2O_3$ is obtained.

As the liquid phase method, the specification of U.S. Pat. No. 3,080,242 describes that by heating a mixture of aluminum hydroxide and boron oxide, a whisker having a composition of $3Al_2O_3.B_2O_3$ or $9Al_2O_3.B_2O_3$ is obtained. In this method, excessive boron oxide acts as the flux. Furthermore, from the report of Bureau of Mines, U.S.A., it is known that a whisker having a composition of $2.5Al_2O_3.B_2O_3$ is obtained by heating a mixture of aluminum oxide, sodium tetraborate and lithium chloride at 1200° C. and that a whisker having a composition of $4.8Al_2O_3.B_2O_3$ is obtained by heating a mixture of aluminum oxide, sodium tetraborate and boron oxide at 1400° C. [Bureau of Mines Report of Investigations, 6575 (1965)]. Also in these methods, the excessive sodium tetraborate/lithium chloride mixture or the excessive sodium tetraborate/boron oxide mixture acts as the flux, and in general, the boric acid component is incorporated in an amount of at least three equivalents and the excessive portion acts as the flux.

Non-whisker aluminum borate can be obtained by pulverizing and mixing an aluminum source component and a boric anhydride source component and heating the mixture at a temperature of 700° to 1200° C. Since the aluminum source component is solid in the above-mentioned temperature range, the reaction becomes heterogeneous, and the aluminum source component exists in the reaction products. In order to grow a whisker in this reaction system, it is necessary to make the reaction mixture as homogeneous as possible and maintain a physical space for the growth of the whisker. For this purpose, boron oxide and an alkali metal borate are incorporated as a flux into the reaction mixture.

However, since the boron oxide and alkali metal borate have a high melt viscosity, the growing rate of the whisker is very low. Accordingly, the viscosity of the reaction mixture should be reduced by incorporating an alkali metal chloride or the like. According to this method, a large whisker of aluminum borate can be obtained, but the excessive boric anhydride source component tends to form a multicomponent glass matrix together with the aluminum source component and the alkali component and the grown whisker is wrapped with this glass matrix. Therefore, the operation of eluting the glass matrix component becomes necessary and hence, a long time is required for isolation of the whisker. Furthermore, the method is defective in that since a part of the aluminum source component is used as the component of the glass matrix, the yield of the aluminum borate whisker is reduced.

SUMMARY OF THE INVENTION

It is therefore a primary object of the present invention to solve the foregoing problems and provide a process for the preparation of an aluminum borate whisker in which the yield of the whisker is increased and the preparation is advantageously carried out on an industrial scale.

Under the above-mentioned background, we made research and investigation and as the result, it was found that the above-mentioned object of the present invention can be attained by using a trialkali aluminum trisulfate as the aluminum source component. We have now completed the process of the present invention based on this finding.

More specifically, in accordance with the present invention, there is provided a process for the preparation of an aluminum borate whisker, which comprises mixing a trialkali aluminum trisulfate represented by the following general formula:

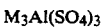

$$M_3Al(SO_4)_3$$

wherein M represents an alkali metal, with at least one boric anhydride source component selected from the group consisting of boron oxides, boron oxyacids and alkali metal salts thereof, and carrying out reaction and growth at a temperature of from 700° to 1200° C.

According to the process of the present invention, by reacting the mixture of the boric anhydride source component and trialkali aluminum trisulfate at a temperature of from 700° to 1200° C., the trialkali aluminum trisulfate begins to melt at a temperature of about 700° C., which is the melting point of the trialkali aluminum trisulfate, and if the temperature is further elevated, the trialkali aluminum trisulfate is gradually decomposed into $Al_2O_3$ and an alkali metal sulfate and $Al_2O_3$ reacts with $B_2O_3$, and the crystal of the aluminum borate whisker grows in this melt.

The aluminum borate whisker obtained according to the process of the present invention has a chemical composition represented by the following formula:

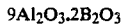

$$9Al_2O_3.2B_2O_3$$

and this whisker generally has a fiber diameter of 0.05 to 5 μm, a fiber length 2 to 300 μm and an aspect ratio of 5 to 100.

DETAILED DESCRIPTION OF THE INVENTION

The trialkali aluminum trisulfate used as the aluminum source component in the present invention is obtained by mixing an aluminum source compound with an alkali metal sulfate and heating and reacting the mixture at about 500° to about 700° C. Trisodium aluminum trisulfate and tripotassium aluminum trisulfate as typical instances of the trialkali aluminum trisulfate have melting points of 695° C. and 675° C., respectively.

The metal molar ratio between the aluminum source compound and the alkali metal sulfate in the starting material is ordinarily ⅓, but by changing this molar ratio, the trialkali aluminum trisulfate forms a eutectic mixture with the alkali metal sulfate or alum and control of the size of the grown whisker becomes possible. More specifically, if the proportion of the alkali metal sulfate is increased, the whisker tends to grow into a large size, but if the proportion of the alkali metal sulfate is decreased, the whisker tends to become small.

In carrying out the process of the present invention, the trialkali aluminum trisulfate can be obtained by reacting at least one member selected from the group consisting of aluminum sulfate, aluminum oxide, aluminum hydroxide, aluminum sodium sulfate, aluminum potassium sulfate and hydrates thereof with at least one member selected from the group consisting of sodium sulfate, potassium sulfate, sodium pyrosulfate, potassium pyrosulfate, sodium persulfate, potassium presulfate and hydrates thereof.

As the boric anhydride source component suitable for carrying out the process of the present invention, there can be mentioned boric acid, pyroboric acid, metaboric acid, sodium tetraborate, potassium tetraborate, sodium metaborate, hydrates of these salts, and boron alkoxides such as $B(OC_2H_5)_3$.

In carrying out the process of the present invention, the trialkali aluminum trisulfate and the boric anhydride source component are mixed so that the aluminum/boron molar ratio is from 6/4 to 9/2 that is the equivalent ratio, and the temperature of the mixture is elevated at a rate of 2° to 50° C. in a crucible and finally, the mixture is maintained at a temperature of 900° to 1200° C. for 30 minutes to 8 hours to effect reaction, whereby an aluminum borate whisker can be grown.

A grown aluminum borate whisker can also be obtained by using the above-mentioned alkali metal sulfate and the aluminum source compound instead of the trialkali aluminum trisulfate, mixing them with the boric anhydride source component and carrying out the reaction and growth under the same conditions as described above. In the case where a large quantity of the starting material is used, the trialkali aluminum trisulfate should be completely formed by maintaining the reaction mixture at a temperature of about 500° to about 700° C.

The aluminum borate whisker obtained according to the above-mentioned process generally has a diameter of about 2 μm and a length of about 50 μm, and by changing the alkali melt component in the starting material, the diameter and length can be increased or decreased within ranges of from about 0.2 to about 5 μm and from about 5 to about 300 μm, respectively.

The grown aluminum borate whisker can be isolated by removing the flux and other water-soluble substances by using hot hydrochloric acid having a concentration of about 1N, hot sulfuric acid, hot nitric acid, hot caustic soda or hot water and washing the residue with water sufficiently. In the case where a water-insoluble by-product, the whisker is separated from the residue by a treatment such as decantation and is then washed with water sufficiently.

At a reaction temperature of from 700° to 1200° C., $Al_2O_3$ which is one of the constituent substances of the aluminum borate whisker is solid, and therefore, it is necessary to maintain a space for the growth of the whisker by substantially liquefying the reaction mixture. For this purpose, in the present invention, a trialkali aluminum trisulfate such as $Na_3Al(SO_4)_3$ or $K_3Al(SO_4)_3$ is used.

In general, the trialkali aluminum trisulfate begins to melt at about 700° C., and if the temperature is further elevated, the trialkali aluminum trisulfate is gradually decomposed into $Al_2O_3$ and an alkali metal sulfate and the reaction is completed at about 1050° C. If a trialkali aluminum trisulfate is used as the aluminum source component, by utilizing this property, all of the starting compounds can be liquefied and the mixture can be made homogeneous at about 700° C. A eutectic mixture of an alkali metal sulfate formed during the subsequent elevation of the temperature and the trialkali aluminum trisulfate acts as a flux, and $Al_2O_3$ simultaneously formed reacts with $B_2O_3$ and the reaction product grows as a whisker. Since the reaction is thus advanced in the homogeneous system, a large and homogeneous whisker can be obtained.

Furthermore, by changing the amount added of the alkali metal sulfate at the step of forming the trialkali aluminum trisulfate as the aluminum source component, the trialkali aluminum trisulfate forms a eutectic mixture with the alkali metal sulfate or alum, and the size of the grown whisker can be controlled. The reason is considered to be that since the alkali metal sulfate finally acts as the flux, the larger is the amount of the alkali metal component, the more easily grows the whisker.

The present invention will now be described in detail with reference to the following referential example, examples and comparative examples.

REFERENTIAL EXAMPLE

In 5 liters of water were dissolved 291.5 g of aluminum sulfate $[Al_2(SO_4)_3 \cdot 13.4H_2O]$ and 213.1 g of sodium sulfate $[Na_2SO_4]$, and the solution was granulated and dried by the spray-drying method and the temperature of the granulation product contained in an alumina crucible having a capacity of 1 liter was elevated from room temperature at a rate of 10° C. per minute and heating reaction was carried out at 600° C. for 4 hours to obtain 384.2 g of trisodium aluminum trisulfate $[Na_3Al(SO_4)_3]$.

The above procedures were repeated in the same manner except that 261.4 g of potassium sulfate $[K_2SO_4]$ was used instead of sodium sulfate, whereby 432.2 g of tripotassium aluminum trisulfate $[K_3Al(SO_4)_3]$ was obtained.

EXAMPLE 1

In a mortar, 30.73 g (0.08 mole as Al) of trisodium aluminum trisulfate obtained in the Referential Example and 1.01 g (0.02 mole as B) of sodium tetraborate were pulverized and mixed, and the pulverization product was charged in an alumina crucible having an inner capacity of 50 ml and the temperature was elevated at a rate of 10° C. per minute in an electric furnace. Reaction was carried out at a temperature of 1100° C. for 4 hours. The reaction product was cooled, and 1000 ml of 1N hydrochloric acid was added to the reaction product and the mixture was boiled to remove the residual flux component by dissolution. After water washing and drying, the quantitative analysis of aluminum and boron was carried out. As the result, it was found that 4.18 g of a whisker having a composition of $9Al_2O_3 \cdot 2B_2O_3$ was obtained. The whisker had a diameter of about 3 μm and a length of about 30 μm, and the yield of the whisker was 89%.

EXAMPLE 2

The treatment of 34.57 g (0.08 mole as Al) of tripotassium aluminum trisulfate obtained in the Referential Example and 1.24 g (0.02 mole as B) of boric acid was carried out under the same conditions as described in Example 1 to obtain 4.00 g of a whisker having a composition of $9Al_2O_3 \cdot 2B_2O_3$. The whisker had a diameter of about 2 μm and a length of about 50 μm. The yield of the whisker was 85%.

EXAMPLE 3

The treatment of 34.57 g (0.08 mole as Al) of tripotassium aluminum trisulfate obtained in the Referential Example and 1.53 g (0.02 mole as B) of potassium tetraborate was carried out under the same conditions as described in Example 1 to obtain 3.85 g of a whisker having a composition of $9Al_2O_3 \cdot 2B_2O_3$. The obtained whisker had a diameter of about 2 μm and a length of 50 μm. The yield of the whisker was 82%.

EXAMPLE 4

The treatment of 34.57 g (0.08 mole as Al) of tripotassium aluminum trisulfate obtained in the Referential Example, 1.24 g (0.02 mole as B) of boric acid and 6.97 g (0.08 mole) of potassium sulfate was carried out under the same conditions as described in Example 1 to obtain 3.76 g of a whisker having a composition of $9Al_2O_3 \cdot 2BO_3$. The obtained whisker had a diameter of about 5 μm and a length of about 300 μm. The yield of the whisker was 80%.

EXAMPLES 5 through 15

A mixture comprising aluminum sulfate or an alkali alum, an alkali metal sulfate and a boric anhydride source component at a mixing ratio shown in Tables 1 and 2 was pulverized and blended in a mortar, and the pulverization product was charged in an aluminum crucible having an inner capacity of 50 ml and the temperature was gradually elevated at a rate of 5° C. per minute in an electric furnace and reaction was carried out 1100° C. for 4 hours. The reaction product was cooled and 1000 ml of 1N hydrochloric acid was added to the reaction product, and the mixture was boiled to remove the residual flux by dissolution. The residue was washed with water and dried to obtain a whisker having a composition of $9Al_2O_3 \cdot 2B_2O_3$. The shape, amount obtained and yield of the whisker were as shown in Tables 1 and 2.

TABLE 1

|  | Example 5 | Example 6 | Example 7 | Example 8 | Example 9 | Example 10 |
|---|---|---|---|---|---|---|
| $Al_2(SO_4)_3$ | 0.08 mole, 13.69 g | 0.08 mole, 13.69 g | 0.08 mole, 13.69 g | 0.06 mole, 10.27 g | 0.08 mole, 13.69 g | |
| $Al_2(SO_4)_3 \cdot 13.4H_2O$ | | | | | | 0.07 mole, 20.41 g |
| $Na_2SO_4$ | | | | | 0.24 mole, 17.04 g | 0.24 mole, 17.04 g |
| $K_2SO_4$ | 0.16 mole, 13.94 g | 0.24 mole, 20.91 g | 0.40 mole, 34.85 g | 0.18 mole, 15.68 g | | |
| $H_3BO_3$ | 0.02 mole, 1.24 g | 0.02 mole, 1.24 g | 0.02 mole, 1.24 g | 0.04 mole, 2.47 g | 0.02 mole, 1.24 g | |
| $Na_2B_4O_7 \cdot 5H_2O$ | | | | | | 0.03 mole, 2.18 g |
| Diameter (μm) of whisker | 0.5 | 1.5 | 5 | 1.5 | 2 | 1.5 |
| Length (μm) of whisker | 15 | 50 | 300 | 50 | 30 | 50 |
| Amount (g) of obtained whisker | 3.43 | 3.62 | 3.52 | 2.36 | 4.23 | 2.88 |
| Yield of whisker | 73% | 77% | 75% | 67% | 90% | 70% |

TABLE 2

|  | Example 11 | Example 12 | Example 13 | Example 14 | Example 15 |
|---|---|---|---|---|---|
| $NaAl(SO_4)_2 \cdot 12H_2O$ | 0.075 mole, 34.37 g | 0.075 mole, 34.37 g | 0.075 mole, 34.37 g | | |
| $KAl(SO_4)_2$ | | | | 0.075 mole, 19.37 g | 0.075 mole, 19.37 g |
| $Na_2SO_4$ | 0.075 mole, 5.33 g | 0.15 mole, 10.65 g | 0.225 mole, 15.98 g | | |
| $K_2SO_4$ | | | | 0.16 mole, 13.07 g | 0.15 mole, 13.07 g |
| $H_3BO_3$ | 0.025 mole, 1.55 g | 0.025 mole, 1.55 g | 0.025 mole, 1.55 g | 0.025 mole, 1.55 g | |
| $Na_2B_4O_7$ | | | | | 0.025 mole, 1.26 g |
| Diameter (μm) of whisker | 0.5 | 2 | 5 | 1.5 | 1.5 |
| Length (μm) of whisker | 5 | 30 | 100 | 50 | 50 |
| Amount (g) of obtained whisker | 4.01 | 4.18 | 4.10 | 3.52 | 3.52 |
| Yield of whisker | 91 | 95 | 93 | 80 | 80 |

In Tables 1 and 2, the mole number of each of $Al_2(SO_4)_3$, $NaAl(SO_4)_2$ and $KAl(SO_4)_2$ is the mole number of aluminum, the mole number of each of $Na_2SO_4$ and $K_2SO_4$ is the mole number of the alkali metal, and the mole number of each of H₃BO₃ and Na₂B₄O₇ is the mole number of boron.

EXAMPLE 16

In a mortar, 2.04 g (0.04 mole as Al) of aluminum oxide, 16.22 g (0.12 mole as K) of potassium persulfate and 0.62 g (0.01 mole as B) of boric acid were pulverized and mixed, and the pulverization product was charged in a platinum crucible having an inner capacity of 50 ml. In an electric furnace, the temperature was elevated at a rate of 5° C. per minute to 700° C. and at a rate of 10° C. per minute in the region exceeding 700° C., and reaction was carried out at 1150° C. for 2 hours. The reaction product was cooled, and 1000 ml of 1N hydrochloric acid was added to the reaction product and the mixture was boiled to remove the residual flux component by dissolution. The residue was washed with water and dried to obtain 1.48 g of a whisker having a composition of 9Al₂O₃.2B₂O₃. The obtained whisker had a diameter of about 2 μm and a length of about 40 μm. The yield of the whisker was 63%.

EXAMPLE 17

The treatment of 3.12 g (0.04 mole as Al) of aluminum hydroxide, 13.33 g (0.12 mole as Na) of sodium pyrosulfate and 0.62 g (0.01 mole as B) of boric acid was carried out under the same conditions as described in Example 16 to obtain 1.64 g of a whisker having a composition of 9Al₂O₃.2B₂O₃. The whisker had a diameter of about 2 μm and a length of about 20 μm. The yield of the whisker was 70%.

COMPARATIVE EXAMPLES 1 through 4

A whisker having a composition of 9Al₂O₃.2B₂O₃ was synthesized without passing through a trialkali aluminum trisulfate.

Aluminum oxide or aluminum hydroxide, boric acid or sodium pyrosulfate, and sodium chloride or potassium chloride were mixed at a mixing ratio shown in Table 3, and the mixture was charged in an alumina crucible having an inner capacity of 50 ml. The temperature was elevated at a rate of 10° C. per minute in an electric furnace and reaction was carried out at 1100° C. for 4 hours. The reaction product was cooled, and 1000 ml of 1N hydrochloric acid was added to the reaction product and the mixture was boiled to remove the residual flux component by dissolution. The residue was washed with water and dried to obtain a whisker having a composition of 9Al₂O₃.2B₂O₃. The shape, obtained amount and yield of the whisker were as shown in Table 3.

TABLE 3

|  | Comparative Example 1 | Comparative Example 2 | Comparative Example 3 | Comparative Example 4 |
| --- | --- | --- | --- | --- |
| α-Al₂O₃ |  |  | 0.02 mole, 1.02 g | 0.06 mole, 3.05 g |
| Al(OH)₃ | 0.04 mole, 3.12 g | 0.08 mole, 6.24 g |  |  |
| H₃BO₃ |  |  | 0.08 mole, 4.95 g | 0.04 mole, 2.47 g |
| Na₂B₄O₇ | 0.06 mole, 3.02 g | 0.02 mole, 1.01 g |  |  |
| NaCl | 0.30 mole, 17.53 g | 0.30 mole, 17.53 g |  |  |
| KCl |  |  | 0.30 mole, 22.37 g | 0.30 mole, 22.37 g |
| Diameter (μm) of whisker | 1 | 0.05 | 2 | 4 |
| Length (μm) of whisker | 30 | 5 | 50 | 20 |
| Amount (g) of obtained whisker | 0.94 | 3.29 | 0.35 | 1.76 |
| Yield of whisker | 40 | 70 | 30 | 50 |

In Table 3, the mole number of each of α-Al₂O₃ and Al(OH)₃ is the mole number of aluminum, the mole number of each of NaCl and KCl is the mole number of the alkali metal, and the mole number of each of H₃BO₃ and Na₂B₄O₇ is the mole number of boron.

As is apparent from the foregoing description, the yield of the whisker obtained in the process of the present invention is higher than the yields attained in the conventional processes and the size of the whisker is uniform and the process of the present invention is very suitable as the industrial preparation process.

We claim:

1. A process for the preparation of an aluminum borate whisker, which consists essentially of mixing as an aluminum source component, trisodium or tripotassium aluminum trisulfate or mixtures thereof represented by the following general formula:

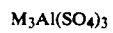

$$M_3Al(SO_4)_3$$

wherein M represents an alkali metal selected from the group consisting of sodium, potassium, with at least one boric anhydride source component selected from the group consisting of boron oxides, boron oxyacids and alkali metal salts thereof, and reacting the mixture of a temperature of from 700° to 1200° C. to effect growing of said aluminum borate whisker.

2. A process according to claim 1, wherein the aluminum borate whisker has a chemical composition of 9Al₂O₃.2B₂O₃, a fiber diameter of 0.05 to 5 μm, a fiber length of 2 to 300 μm and an aspect ratio of 5 to 100.

3. A process according to claim 1, wherein the trialkali aluminum trisulfate and the boric anhydride source component are mixed so that the aluminum/boron molar ratio is from 6/4 to 9/2 and the main component of the aluminum borate whisker has a composition of 9Al₂O₃.2B₂O₃.

4. A process according to claim 3 wherein the reaction is carried out at a temperature of from 900° to 1200° C. for from 30 minutes to 8 hours.

5. A process for preparing aluminum borate whisker consisting essentially of (1) feeding (a) an alumina source component selected from the group consisting of trisodium aluminum trisulfate, tripotassium aluminum trisulfate and mixtures thereof and (b) at least one boric anhydride source component selected from the group consisting of boric oxide, boron oxyacid, alkali metal salts thereof, and mixtures thereof into a mixing vessel, (2) mixing (a) and (b) in said mixing vessel, and (3) heating and reacting said mixture at a temperature of from 700° to 1200° C. for a time sufficient to effect growth of said aluminum borate whisker.

* * * * *